United States Patent
Nakano et al.

(10) Patent No.: US 6,954,033 B2
(45) Date of Patent: Oct. 11, 2005

(54) PLASMA PROCESSING APPARATUS (75) Inventors: Akira Nakano, Miyagi-ken (JP);
Tadashi Kumagai, Fukushima-ken (JP);
Tadahiro Ohmi, 2-1-27 Komegafukuro,
Aoba-ku, Sendai-shi, Miyagi-ken (JP)

(73) Assignees: Alps Electric Co., Ltd., Tokyo (JP);
Tadahiro Ohmi, Sendai (JP)

(*) Notice: Subject to any disclaimer, the term of this patent is extended or adjusted under 35 U.S.C. 154(b) by 331 days.

(21) Appl. No.: 10/302,666

(22) Filed: Nov. 21, 2002

(65) Prior Publication Data

US 2003/0098127 A1 May 29, 2003

(30) Foreign Application Priority Data

Nov. 27, 2001 (JP) .................................. 2001-361377

(51) Int. Cl.⁷ .......................... H01J 7/24; C23C 16/00
(52) U.S. Cl. ............................ 315/111.71; 118/723 E
(58) Field of Search ....................... 315/111.11, 111.71, 315/111.21, 111.51, 111.52, 11.91; 118/723 MW, 723 E; 219/696, 746

(56) References Cited

U.S. PATENT DOCUMENTS

| | | | |
|---|---|---|---|
| 5,605,576 A | 2/1997 | Sasaki et al. ............. | 118/723 E |
| 6,252,354 B1 * | 6/2001 | Collins et al. ............ | 315/111.51 |
| 6,259,334 B1 * | 7/2001 | Howald ...................... | 333/17.3 |
| 6,806,438 B2 * | 10/2004 | Nakano et al. ............ | 219/121.54 |
| 2001/0009139 A1 * | 7/2001 | Shan et al. ................ | 118/723 E |

* cited by examiner

*Primary Examiner*—Don Wong
*Assistant Examiner*—Minh Dieu A
(74) *Attorney, Agent, or Firm*—Beyer Weaver & Thomas, LLP (57) ABSTRACT

A plasma processing apparatus of the present invention includes a matching circuit for impedance matching between a radio-frequency generator and a plasma processing chamber, and one or a plurality of impedance converting circuits provided between the matching circuit and the radio-frequency generator. The impedance converting circuit converts an impedance to decrease a difference in impedance to be matched by the matching circuit, thereby decreasing a change in the output impedance with a moving amount of a capacitance control of one of variable passive elements of the matching circuit, such as a load capacitor and a tuning capacitor. Therefore, a change in the impedance of the plasma processing chamber can be finely controlled.

11 Claims, 6 Drawing Sheets

PLASMA PROCESSING APPARATUS

BACKGROUND OF THE INVENTION

1. Field of the Invention

The present invention relates to a plasma processing apparatus used for plasma treatments, and particularly to a plasma processing apparatus comprising a matching circuit corresponding to the impedance of a plasma processing chamber of the plasma processing apparatus.

2. Description of the Related Art

Figure 4:
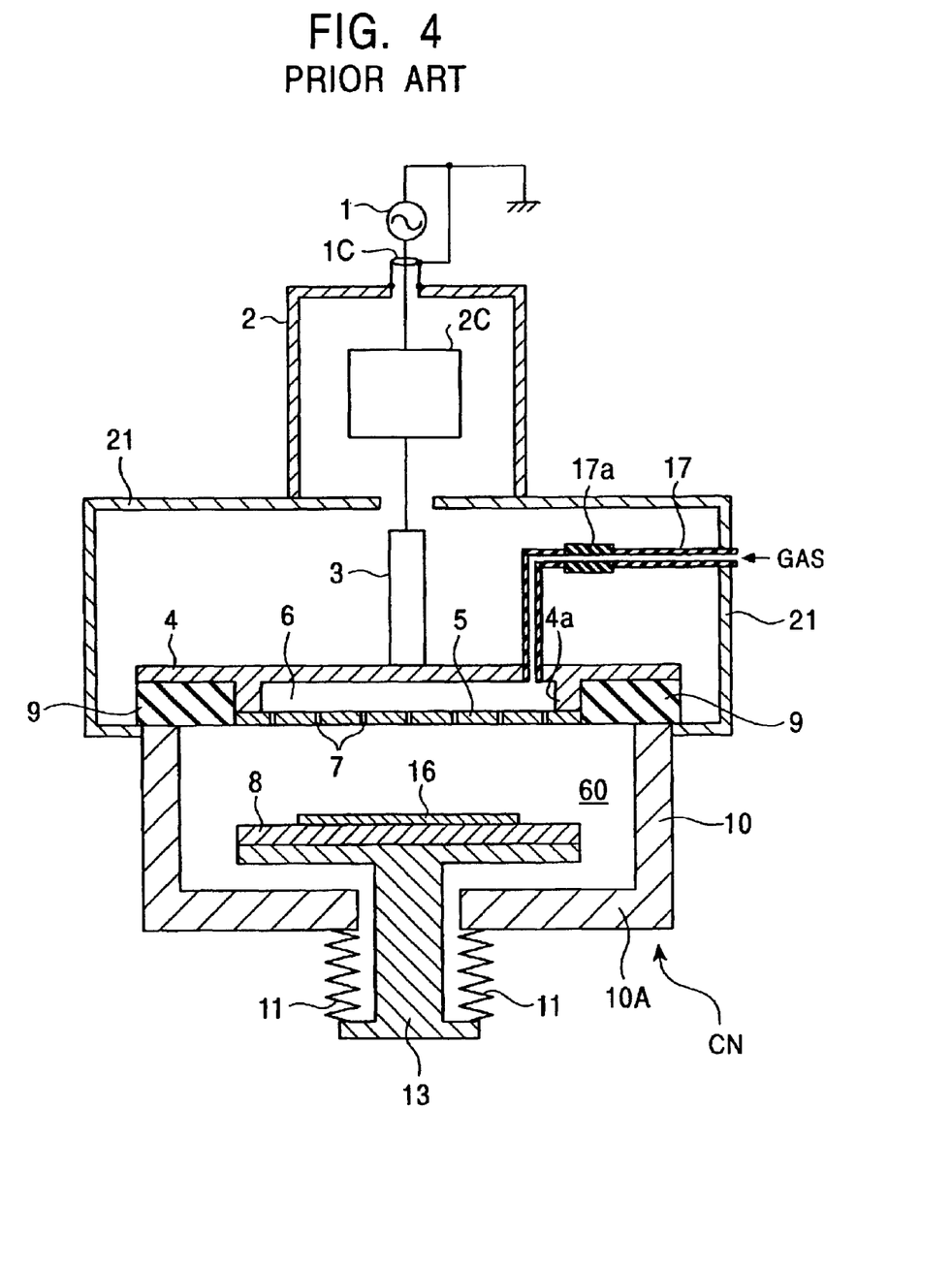
FIG. 4 is a conceptual diagram showing the outline of an example of conventional plasma processing apparatuses.

FIG. 4 illustrates a conventional single-excitation plasma processing apparatus for plasma treatments such as CVD (chemical vapor deposition), sputtering, dry etching, ashing, etc.

Figure 5:
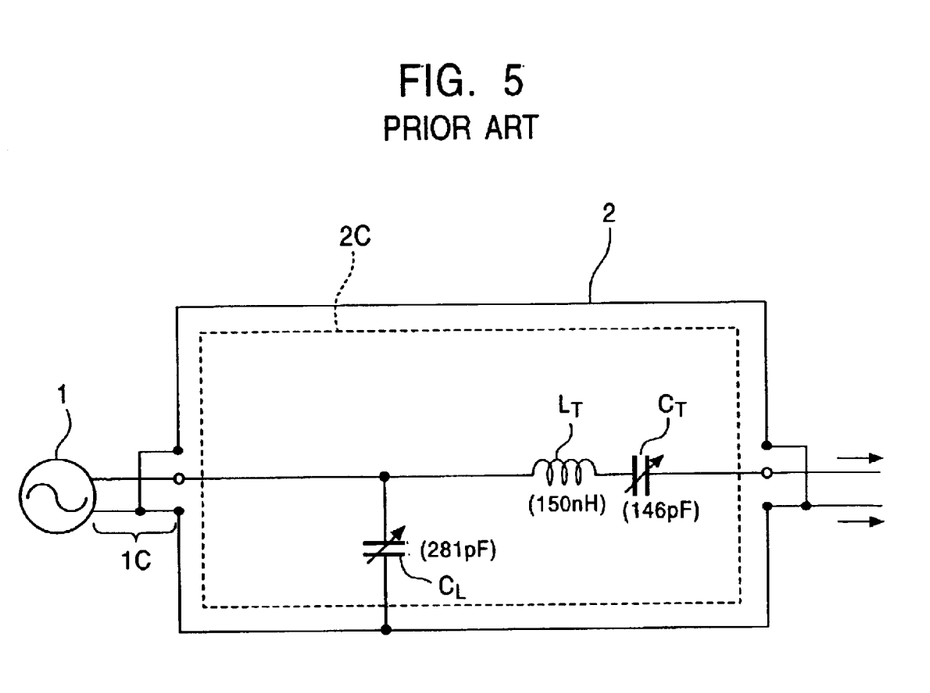
FIG. 5 is a conceptual diagram showing the configuration of the matching circuit 2C in the matching box 2 shown in FIG. 4.

The plasma processing apparatus shown in FIG. 4 comprises the matching circuit 2C shown in further detail in FIG. 5, which is provided between a radio frequency generator 1 and a plasma excitation electrode 4. The matching circuit 2C is provided for achieving impedance matching between the radio frequency generator 1 and the plasma excitation electrode 4.

Radio frequency power from the radio frequency generator 1 is supplied through the matching circuit 2C to a supply plate 3 and then to the plasma excitation electrode 4. The matching circuit 2C is contained in a matching box 2 comprising a dielectric housing, whereas the plasma excitation electrode 4 and the supply plate 3 are covered with a chassis 21 comprising a conductor.

The plasma excitation electrode (cathode electrode) 4 includes protrusions 4a provided on the lower surface thereof, and a shower plate 5 having many holes 7 is provided in contact with the protrusions 4a of the plasma excitation electrode 4. Also, a space 6 is formed between the plasma excitation electrode 4 and the shower plate 5. A conductive gas inlet pipe 17 is connected to the space 6, and an insulator 17a, for insulating the plasma excitation electrode 4 from the gas supply source side, is inserted at an intermediate position of the gas inlet pipe 17.

The gas introduced from the gas inlet pipe 17 is supplied through the holes of the shower plate 5 to the inside of a chamber 60 formed by a chamber wall 10. In FIG. 4, reference numeral 9 denotes an insulator for insulating the chamber wall 10 from the plasma excitation electrode 4. The exhaust system for the plasma apparatus is not shown in the drawing.

A wafer susceptor (susceptor electrode 8) which also serves as a plasma excitation electrode is provided in the chamber 60, and supported by a shaft 13, a substrate 16 being mounted on the wafer susceptor 8.

The lower end of the shaft 13 is connected to the chamber bottom 10A through a bellows 11 so as to hermetically close the chamber 60.

The wafer susceptor 8 and the shaft 13 can be vertically moved by the bellows 11 so that the distance between the plasma excitation electrodes 4 and 8 can be controlled.

The wafer susceptor 8 is grounded for DC voltage, and has the same potential as the chamber wall 10 for DC voltage.

In the plasma processing apparatus, electric power at a frequency of about 40.68 MHz is generally supplied to generate a plasma between both electrodes 4 and 8 for plasma treatments such as CVD (chemical vapor deposition), sputtering, dry etching, and ashing.

The main components of the plasma processing apparatus, including the plasma processing chamber, are typically manufactured by an apparatus manufacturer whereas the matching circuit is typically manufactured by a separate entity, usually one specializing in the manufacture of electrical components or circuits.

As a result, a user of the plasma processing apparatus must use the matching circuit 2C to perform impedance matching between the plasma processing chamber and the radio frequency generator for each plasma treatment such as sputtering, dry etching, ashing, or the like.

The impedance (load impedance) of the plasma processing chamber includes an impedance $Z0$ before plasma generation and an impedance $Z1$ after plasma generation.

The impedance $Z0$ is determined to some extent in a designing process by the manufacturer of the chamber and can be precisely measured for that specific chamber. However, plasma processing apparatuses having identical dimensions cannot realistically be manufactured. Hence, the produced plasma processing chambers have different impedances due to variations of the chamber dimensions from the specified nominal sizes.

Furthermore, after the plasma is generated, the impedance $Z1$ varies with process parameters including the flow rate of gas used, the degree of vacuum in the plasma processing chamber, and the distance between the two electrodes 4 and 8. Thus, the impedance $Z1$ will differ from one plasma treatment to the next in the same plasma processing apparatus.

For example, in a dry etching apparatus, the impedance $Z1$ varies with the type of thin film material to be etched and etching conditions such as the etching rate and the shape of a portion to be etched. Also, in a film deposition apparatus, the impedance $Z1$ varies with the process gas used for forming a thin film and deposition conditions such as the deposition rate and the structure of the thin film.

With the conventional plasma apparatus, the user adjusts the output impedance of the matching circuit 2C to the impedance $Z0$ At the beginning of the plasma processing, and after plasma discharge is started, plasma discharge is stabilized according to the impedance $Z1$.

However, the characteristic impedance of the power supply system of the radio-frequency generator 1 is 50 $\Omega$, while the impedance ($Z0$ and $Z1$ of the plasma processing chamber CN is less than 10 $\Omega$. Thus, the large difference between both impedances must be compensated in the matching circuit.

FIG. 5 is a conceptual diagram showing the outline of the circuit configuration of the matching circuit 2C.

The radio frequency generator 1 supplies electric power for plasma discharge to the plasma processing chamber CN through a coaxial cable 1C and the matching circuit 2C.

For example, in the case where the coaxial cable 1C has a characteristic impedance of 50 $\Omega$, the frequency of radio-frequency power used for plasma discharge is 40.68 MHz, and the impedance $Z1$ is "3.6 $\Omega$+j1.4 $\Omega$", the passive elements in the matching circuit 2C may be selected to provide matching. In this case, in order to achieve matching between the characteristic impedance of the coaxial cable and the impedance of the plasma processing chamber, a tuning inductor $L_T$ is fixed at 150 nH, and thus the capacitance of a load capacitor $C_L$ is 281 pF, and the capacitance of a tuning capacitor $C_T$ is 146 pF.

Figure 6:
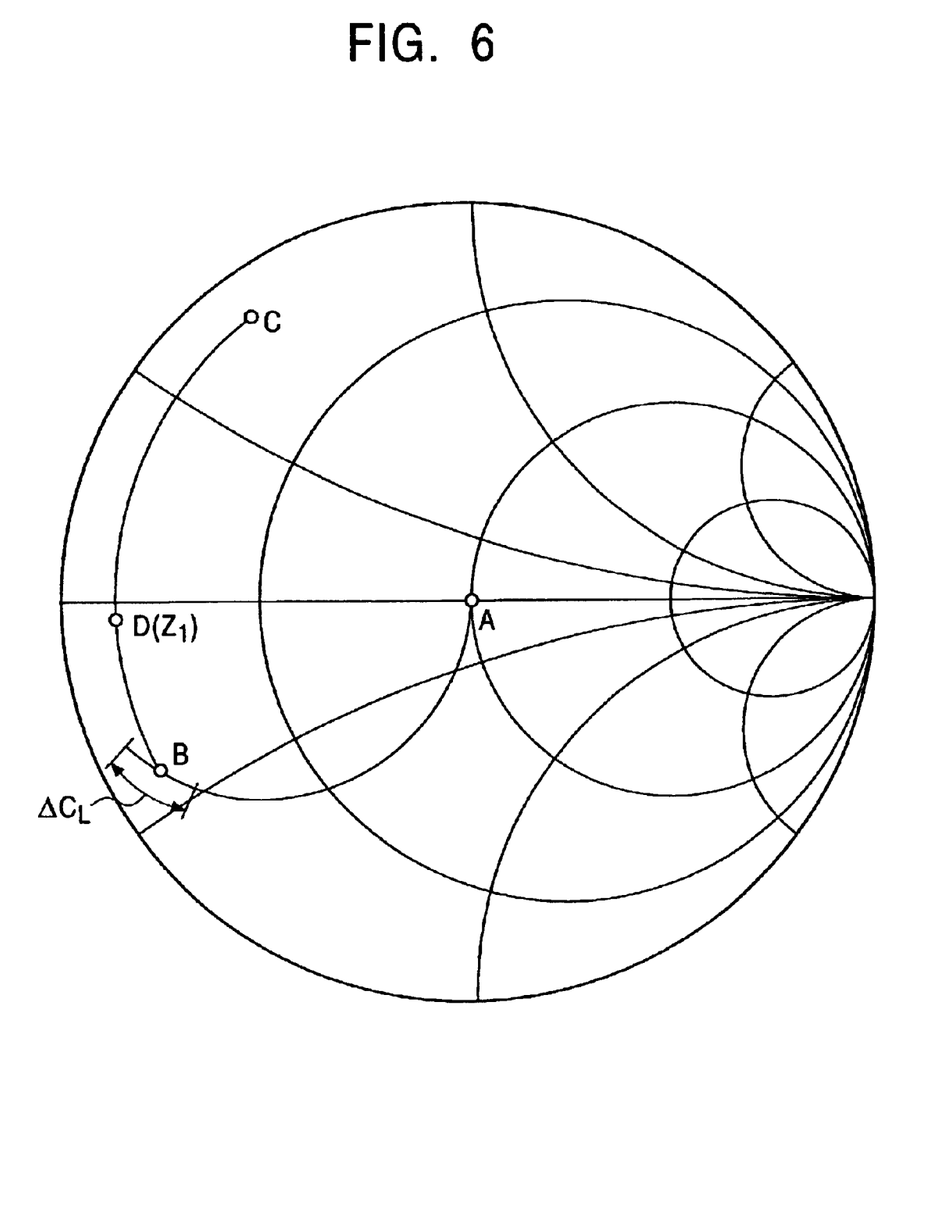
FIG. 6 is a Smith chart showing the relationship between the parameter of each of passive elements of the matching circuit 2C shown in FIG. 3 and the impedance Z1 to be matched.

The relationship between the parameter of each of the passive elements and the impedance $Z1$ to be matched is confirmed by a Smith chart as illustrated in FIG. 6. The Smith chart is normalized by the characteristic impedance 50 Ω of the power supply system.

In FIG. 6, point A represents the start point of the impedance to be matched where the characteristic impedance of the coaxial cable 1C is 50 Ω.

Then, the impedance to be matched is moved from point A to point B on an admittance chart by the load capacitor $C_L$.

At point B, the impedance to be matched has a real part corresponding to "3.6 Ω".

The impedance to be matched is further moved from point B to point C on an impedance chart by the tuning inductor $L_T$.

Finally, the impedance to be matched is matched with the value of point D, i.e., the impedance Z1, by adjusting the capacitance of the tuning capacitor $C_T$.

Assuming that the impedance Z1 varies by 50% (in the variation range of load) due to the conditions of the process, the real part of 3.6 Ω varies between 5.4 Ω and 1.8 Ω. In this case, the capacitance of the load capacitor $C_L$ must be controlled in the range of 405 pF for controlling the real part of the impedance from 3.6 Ω to 5.4 Ω to 225 pF for controlling the real part of the impedance from 3.6 Ω to 1.8 Ω with the center of the range at 275 pF.

Therefore, the capacitance of the load capacitor $C_L$ is controlled in the range of −20% (225 pF) to 44% (405 pF) with the center at 275 pF.

With the narrow control range, for example, the output impedance greatly varies with changes in the capacitance of the load capacitor $C_L$. Namely, the control sensitivity of the output impedance to movement of a capacitance control increases. In other words, the output impedance is highly sensitive to changes in the load capacitor.

Thus, when the impedance is controlled by the matching circuit as shown comprising the variable passive elements such as the load capacitor $C_L$ and the like, the control sensitivity of the variable passive elements increases to cause problems in matching stability where a change in load (the impedance of the plasma processing chamber CN) occurs.

Even in the same processing apparatus the load varies according to a number of parameters. For example, the load changes with the lots and wafers to be processed due to the influence of the conditions of the process performed in the plasma processing chamber CN, the sizes and number of the wafers, and the reaction by-products produced in plasma processing.

Also, the plasma processing chamber CN may be opened for exchanging a part in the plasma processing chamber in a maintenance activity performed on the plasma processing chamber. This influences the dimensions of the apparatus, and thus changes the impedance of the plasma processing chamber CN after the maintenance work, causing the load change as a change in the plasma processing chamber Z1 after plasma discharge.

Furthermore, in a plasma processing system comprising a processing apparatus having a plurality of plasma processing chambers, or a plurality of plasma processing apparatuses, the impedance varies with the plasma processing chambers because the plasma processing chambers in the same apparatus are different in dimensions due to variations during the manufacture of the apparatus. Therefore, in this case, the load change occurs as an impedance change associated with the plasma processing chambers after plasma discharge.

Therefore, when impedance matching is performed by the matching circuit comprising the variable passive elements having high control sensitivity, matching to the load change is a sensitive process and hence difficult to control, even with only a small load change. Therefore, a conventional matching circuit has the problem of stability even in ordinary use.

As a method for solving the above problem, an amplifier for changing the impedance is contained in the matching circuit provided directly above the plasma processing chamber CN, in order to decrease the sensitivity of impedance control.

However, during use, the temperature of the plasma processing chamber is increased according to the conditions of the process. Thus, thermal stress corresponding to the increase in the temperature is applied to the matching circuit provided directly above the plasma processing chamber, and thus the characteristics of an active element constituting the amplifying circuit vary with the temperature. This thermal stress thus causes a deterioration in the stability of the circuit to impedance change.

In a conventional example, the difference between the input impedance of the matching circuit and the impedance of the plasma processing chamber is decreased, and the characteristic impedance of the coaxial cable for supplying electric power to the matching circuit from the radio frequency generator is controlled to less than 50 Ω which is close to the output impedance of the matching circuit. In this example, the control sensitivity of the matching circuit is decreased to decrease a variation in matching with the load change.

However, in this example, the characteristic impedance of the coaxial cable is normalized, and thus a plurality of special coaxial cables must be ordered from the manufacturer according to the impedance of the plasma processing chamber, which changes based on a plurality of parameters, thereby causing a problem in which an expensive nonstandard coaxial cable is used as the coaxial cable. Accordingly, it is desirable to provide impedance matching circuitry having low control sensitivity and greater stability regarding load changes.

SUMMARY OF THE INVENTION

In consideration of the above-described present conditions, an object of the present invention is to provide a plasma processing apparatus comprising a matching circuit capable of easily controlling an impedance according to the impedance of a plasma processing chamber, and capable of securing low control sensitivity and stability to a load change.

A plasma processing apparatus of the present invention comprises a radio frequency generator (radio frequency generator 1), a plasma processing chamber (plasma processing chamber CN), and matching means (matching circuit 2A) for performing impedance matching between the radio frequency generator and the plasma processing chamber, wherein one or a plurality of impedance converting means (impedance converting circuits 2B) is provided between the matching means and the radio frequency generator, for converting the impedance to decrease a difference in impedance to be matched by the matching circuit, so that the variable range of each of variable passive elements (a load capacitor 206 and a tuning capacitor 205) provided in the matching circuit can be widened.

Namely, the impedance converting means converts the characteristic impedance of a coaxial cable (coaxial cable 1C) to a value close to the impedance of the plasma processing chamber, and thus the difference between the characteristic impedance and the impedance of the plasma processing chamber, which difference must be conventionally matched by the matching circuit, is decreased so that the decreased difference between the value and the impedance of the plasma processing chamber is matched by the matching circuit.

Therefore, in the plasma processing apparatus of the present invention, in impedance matching by controlling the value of each of the variable passive elements when the impedance of the plasma processing chamber varies (load change) after discharge, the variable range of each of the variable passive elements can be widened with respect to the center of the variable range, as compared with the conventional example. For example, a change of the value of the variable passive element according to a moving amount of a control can be decreased to permit fine control in matching with the impedance of the plasma processing chamber. Therefore, the impedance slightly varies when the control is moved to facilitate control of impedance-matching, thereby improving the stability of a plasma discharge state.

Therefore, even when the impedance Z1 varies, the plasma processing apparatus of the present invention is capable of fine control of impedance matching, thereby improving the reproducibility of the plasma discharge state. Also, electric power can be stably supplied to a plasma space in the plasma processing chamber, thereby achieving uniform results of plasma processing of a device to be processed.

In the plasma processing apparatus of the present invention, the impedance converting means comprises the passive elements such as a capacitor and an inductor each having a fixed value, and thus high resistance to thermal stress and high reliability can be obtained, as compared with the amplifier circuit of the conventional example.

Furthermore, since the impedance converting means comprises the passive elements such as the capacitor and the inductor each having a fixed value, a commercial inexpensive part can be used. Therefore, unlike in the conventional example, an expensive custom-made part is not used and the cost of the plasma processing apparatus is not increased.

Furthermore, in the plasma processing apparatus of the present invention, the one or the plurality of impedance converting means converts the output impedance to a value close to the impedance of the plasma processing chamber between the output impedance of the radio frequency generator and the impedance of the plasma processing chamber, thereby decreasing the difference between the output impedance of the impedance converting circuit and the impedance of the plasma processing chamber. Therefore, fine control can be made, and when the impedance Z1 changes, ease of control of the matching circuit according to the stable plasma discharge state can be improved, as compared with the conventional example.

Furthermore, in the plasma processing apparatus of the present invention, the one or the plurality of impedance converting means converts the characteristic impedance of the coaxial cable from 50 Ω to 10 Ω or less. Since the impedance of the plasma processing chamber is less than 10 Ω, the control range of the variable range with respect to the center value can be widened, and a change in the variable passive elements can be finely controlled, as compared with the conventional example. Therefore, when the impedance Z1 varies, ease of control of the matching circuit according to the stable plasma discharge state can be improved.

DESCRIPTION OF THE PREFERRED EMBODIMENTS

A plasma processing apparatus according to an embodiment of the present invention will be described below based on the drawings.

Figure 1:
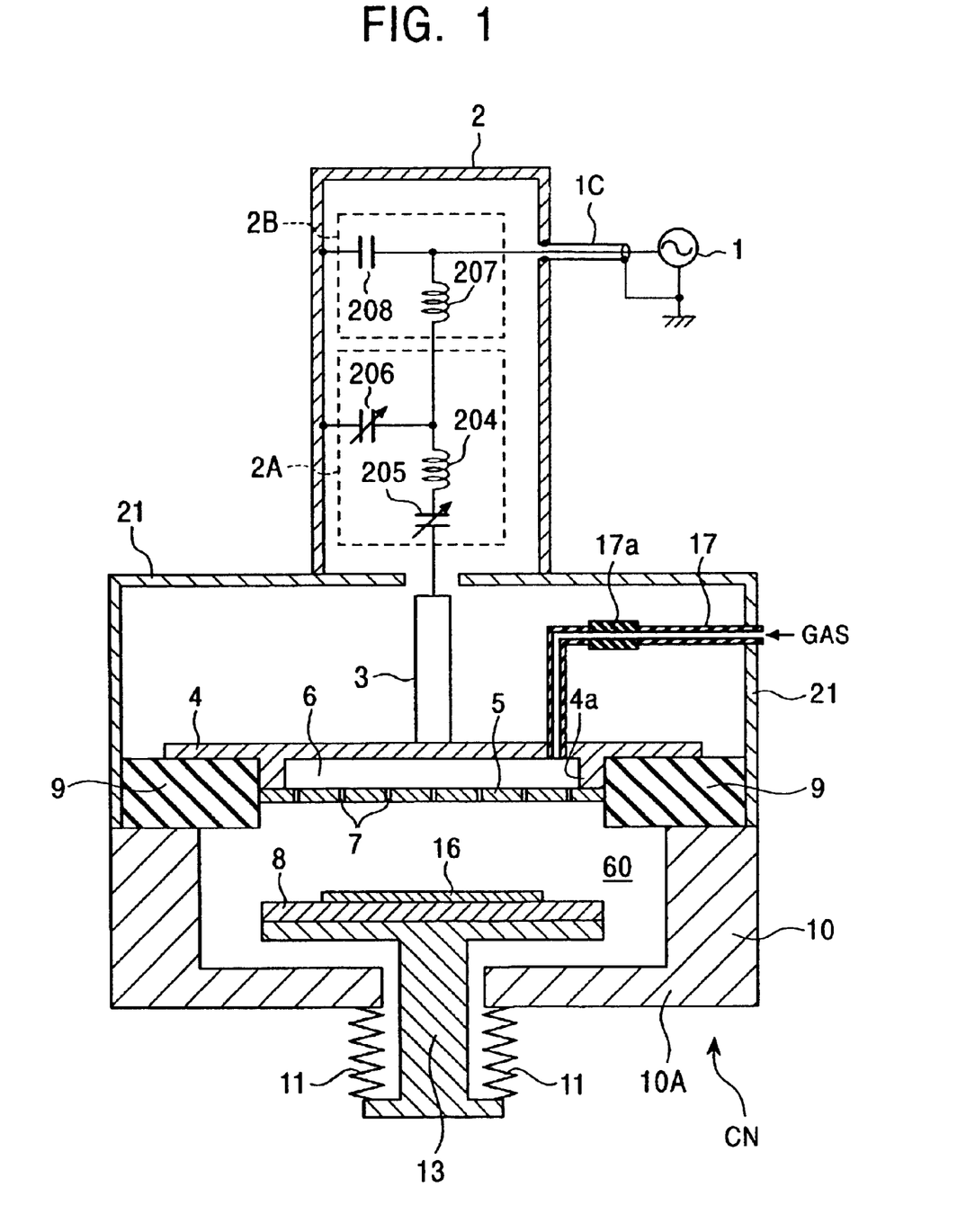
FIG. 1 is a conceptual diagram showing the outline of a plasma processing apparatus according to an embodiment of the present invention.

FIG. 1 is a drawing showing the schematic configuration of the plasma processing apparatus of this embodiment. This figure shows the configurations of a matching circuit 2A and an impedance converting circuit 2B, which are contained in the plasma processing apparatus, as viewed through the side of a matching box 2. In FIG. 1, the same components as in FIG. 4 are denoted by the same reference numerals, and a description thereof is omitted.

The present invention permits fine control of impedance conversion in the matching circuit 2A, by inserting the impedance converting circuit 2B between the coaxial cable 1C and the matching circuit 2A. This results in a decrease in the impedance difference to be matched by the matching circuit 2A, i.e., the difference between the matching circuit's input impedance and the output impedance (the impedance of a plasma processing chamber). Specifically, the impedance converting circuit causes a decrease in the input impedance of the matching circuit 2A.

The configuration will be described in detail below.

The radio frequency generator 1 supplies electric power for plasma discharge to the plasma processing apparatus 21 through the matching box 2.

The matching circuit 2A for matching the output impedance of the radio frequency generator 1 with the load impedance of the plasma processing chamber CN is contained in the matching box 2.

In the matching circuit 2A, the load capacitor 206 and the tuning capacitor 205 are controlled to match the output impedance of the matching circuit 2A with the load impedance of the plasma processing chamber CN. With this arrangement, the radio frequency generator 1 can prevent the occurrence of a reflected wave due to mismatching of the impedances, and can effectively supply electric power for plasma discharge to the plasma processing chamber CN through the matching circuit 2A. The impedance converting circuit 2B converts the value of the characteristic impedance of the coaxial cable 1C to a value close to the load impedance of the plasma processing chamber CN.

For example, a description will be made below based on the assumption that the frequency of radio frequency power supplied from the radio frequency generator 1 is 40.68 MHz, the impedance Z1 (=R1+jX1) is "3.6 Ω+j1.4 Ω", and the characteristic impedance of the coaxial cable 1C of the power supply system is 50 Ω. In this situation, the impedance converting circuit 2B converts the characteristic impedance of 50 Ω (i.e., that of the coaxial cable) to 10 Ω (i.e., that of the impedance Z1) and thus reduces the impedance difference to be matched by the matching circuit 2A.

Figure 2:
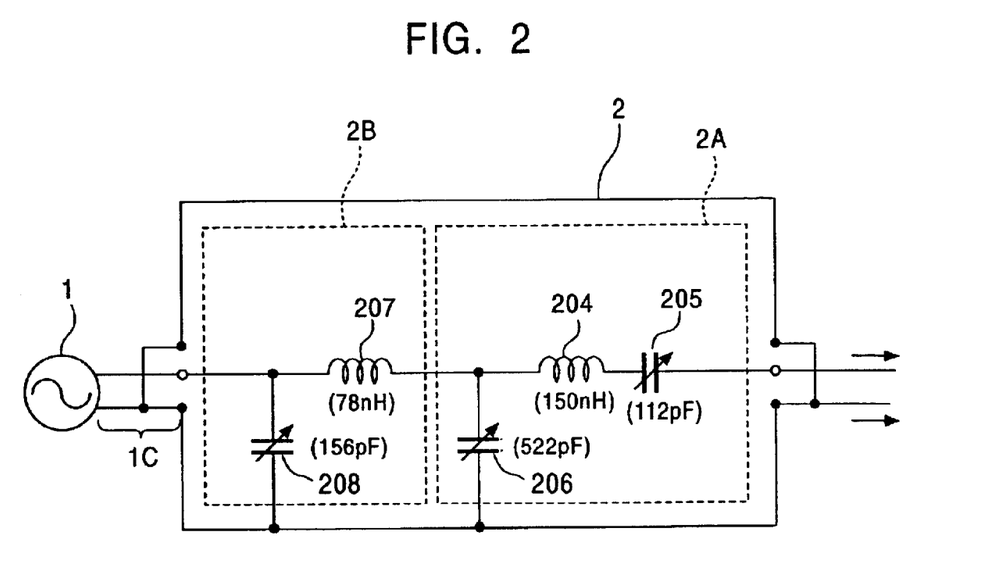
FIG. 2 is a conceptual diagram showing an example of the configuration of the matching circuit 2A in the matching box 2 shown in FIG. 1.

The configurations of the matching circuit 2A and the impedance converting circuit 2B are described below with reference to FIG. 2. FIG. 2 is a drawing showing the schematic configurations of the matching circuit 2A and the impedance converting circuit 2B.

The impedance converting circuit 2B comprises an inductor 207 and a capacitor 208. For example, in one embodiment the inductance of the inductor 207 is 78 nH, and the capacitance of the capacitor 208 is 156 pF. In this embodiment, with the radio-frequency power frequency of 40.68 MHz, the impedance converting circuit 2B converts the characteristic impedance 50 Ω of the coaxial cable 1C to 10 Ω.

Figure 3:
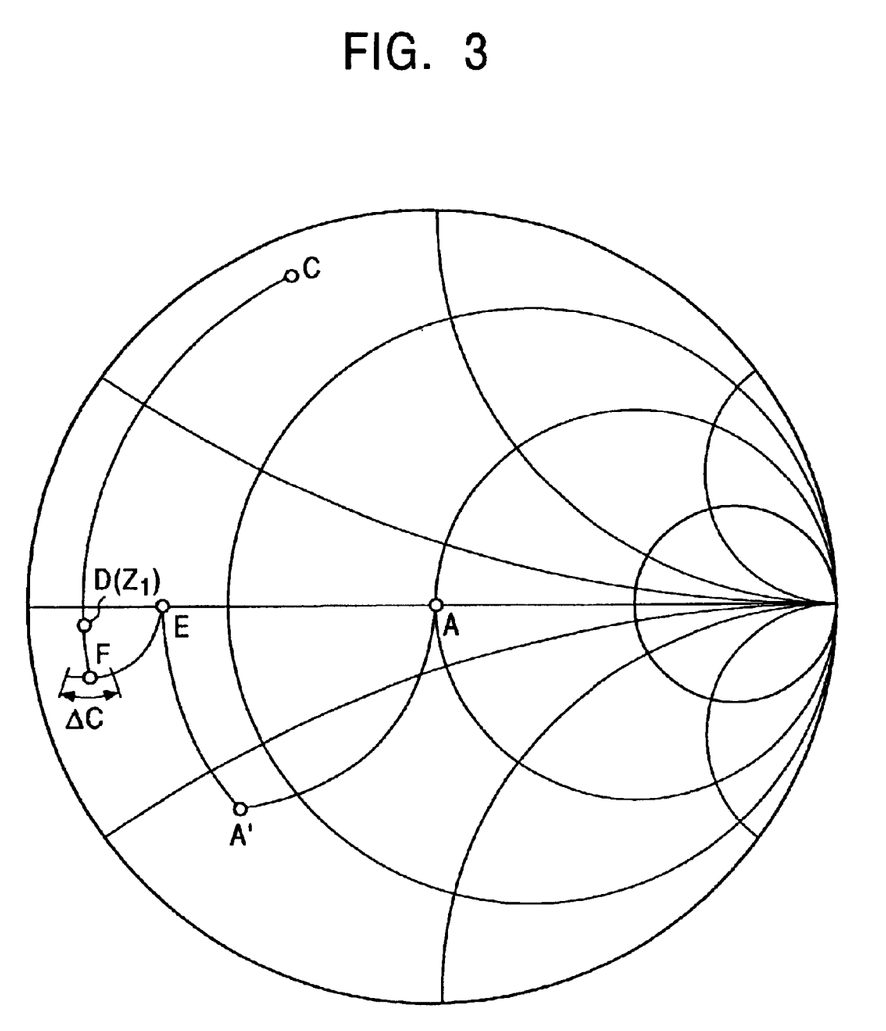
FIG. 3 is a Smith chart showing the relationship between the parameter of each of passive elements of the matching circuit 2A and the impedance converting circuit 2B shown in FIG. 2 and the impedance Z1 to be matched.

A description will be made of the relationship between the parameter of each of the above-described passive elements, and the impedance Z1 to be matched with reference to the Smith chart of FIG. 3. In FIG. 3, point A represents the characteristic impedance 50 Ω of the coaxial cable 1C as the starting point of the impedance to be matched.

The impedance converting circuit 2B converts the characteristic impedance 50 Ω to 10 Ω, namely moves the value of the impedance to be matched from point A to point E through point A'. More specifically, the input impedance of the matching circuit 2A is moved from point A to point A' by the capacitor 208, and moved from point A' to point E by the inductor 207. As a result of the conversion of the characteristic impedance, the control range of the load capacitor 206 is significantly widened. To accommodate the new characteristic impedance, the capacitance of the load capacitor 206 is set to 522 pF.

Point D represents the final output impedance of the matching circuit 2A. The final output impedance is the value of a conjugate complex impedance for the impedance (load impedance) of the plasma processing chamber CN, and thus the value of the impedance Z1* at point D is "3.6 Ω−j1.4 Ω". The impedance Z1* thus refers to the conjugate complex impedance of the impedance Z1.

Next, in the matching process, the value of the impedance to be matched is moved from point E to point F by the capacitance of the load capacitor 206. At point F, the impedance to be matched is a value having a real part corresponding to 3.6 Ω.

Then, the impedance to be matched is moved from point F to point C by the tuning inductor 204 (150 nH).

Finally, the impedance to be matched is matched with the value of point D, i.e., the impedance Z1, by controlling the capacitance of the tuning capacitor 205.

If the impedance Z1 varies by 50% (the range of the load change) according to the conditions of the process, the real part of 3.6 Ω changes between 5.4 Ω and 1.8 Ω. In this case, the control range of the load capacitor 206 extends to 361 pF for controlling the real part of the impedance from 3.6 Ω to 5.4 Ω, and to 835 pF for controlling the real part from 3.6 Ω to 1.8 Ω, with the center of the control range at 522 pF.

Therefore, according to this embodiment, the capacitance of the load capacitor 206 is controlled in the range ΔC (i.e., the control range) of −31% (361 pF) to +60% (835 pF) with the center at 522 pF (i.e., the center value of the control range).

In the present invention, the control range is widened in comparison with the control range of −20% (225 pF) to +44% (405 pF) with the center at 281 pF in the conventional example. Thus, changes in the output impedance of the matching circuit 2A produced by changes in the capacitance of the load capacitor 206 are decreased. Namely, the control sensitivity of the output impedance to movement of the capacitance control of the load capacitor 206 is decreased.

Therefore, when impedance matching is controlled by using the matching circuit comprising the variable passive elements such as the load capacitor 206 and the like, decreasing the control sensitivity of the variable passive element improves the matching stability to a change in load (i.e., the impedance of the plasma processing chamber CN).

Namely, when the control sensitivity is decreased, a change in the output impedance with a moving amount of the capacitance control is decreased and thus permits fine control of the output impedance. With this arrangement, when the impedance Z1 (i.e., that of the load in the plasma chamber) varies, the output impedance in the matching circuit 2A can be finely controlled based on control of the load capacitor 206. This permits fine control of the output impedance in impedance matching with the impedance Z1 of the plasma processing chamber CN. Therefore, the control relationship where the output impedance changes only slightly with a movement of the control facilitates better control of impedance matching, and thereby improves the stability of the plasma discharge state.

Therefore, even when the impedance Z1 varies, the reproducibility of the plasma discharge state can be improved because the output impedance can be finely controlled by impedance matching in the matching circuit 2A, and discharge power can stably be supplied to the plasma space in the plasma processing chamber CN, thereby achieving uniform results in plasma processing of a device.

Since the impedance converting circuit 2B comprises the passive elements such as the capacitor 208 and the inductor 207 each having a fixed value, high resistance to thermal stress and high reliability can be obtained, as compared with the amplifying circuit in the conventional example.

Furthermore, since the impedance converting circuit 2B comprises the passive elements such as the capacitor 208 and the inductor 207 each having a fixed value, a commercial inexpensive part can be used and expensive custom-made parts such as required in the conventional example may be avoided. Thus, the impedance converting circuit 2B does not materially increase the cost of the plasma processing apparatus.

Furthermore, the impedance converting circuit 2B provides better matching between the output impedance (the characteristic impedance of the coaxial cable 1C) of the radio frequency generator 1 and the impedance of the plasma processing chamber by converting the output impedance to a value close to the impedance (for example, the impedance Z1) of the plasma processing chamber. As a result, the difference between the output impedance of the impedance converting circuit 2B and the load impedance of the plasma processing chamber CN can be decreased to permit fine control, as compared with the conventional example. Thus, when the impedance Z1 varies, ease of control of the matching circuit 2A according to the stable plasma discharge state can be improved.

Since the load impedance of the plasma processing chamber CN is 10 Ω or less, when the impedance converting circuit 2B converts the characteristic impedance of the coaxial cable 1C from 50 Ω to near 10 Ω, the control range with respect to the center value of the load capacitor 206 can be widened in comparison with the conventional example.

Therefore, a change in the load capacitor 206 can be finely controlled as compared with the conventional example, and when the impedance Z1 varies, ease of control of the matching circuit 2A according to the stable plasma discharge state can be improved.

Although the embodiment of the present invention is described in detail above with reference to the drawings, the construction is not limited to this embodiment, and the present invention includes changes in design within the scope of the gist of the present invention. That is, the diagrams and examples provided are intended to be illustrative and not limiting. Accordingly, for example, the scope of the present invention is intended to extend to apparatus providing matching for radio frequency generators and plasma processing chambers having impedance values different than those provided in the examples.

In the plasma processing apparatus of the present invention, when the impedance Z1 varies, the capacitance of the load capacitor can be finely controlled to decrease a change in the output impedance with a moving amount of the capacitance control in the matching circuit 2A. Also, in impedance matching with the impedance Z1 of the plasma processing chamber CN, the output impedance can be finely controlled to avoid a large change in the impedance Z1 when the control is moved, thereby facilitating control of impedance matching and improving the stability of the plasma discharge state.

Furthermore, in the plasma processing apparatus of the present invention, the impedance converting means comprises a passive element having a fixed value, and thus high resistance to thermal stress and high reliability can be obtained. Also, unlike in the conventional example, a commercial inexpensive part can be used without using an expensive custom-made part, thereby preventing an increase in cost of the plasma processing apparatus.

What is claimed is:

1. A plasma processing apparatus comprising:
   a radio-frequency generator;
   a plasma processing chamber,
   matching moans for performing impedance matching between the radio frequency generator and the plasma processing chamber; and
   one or a plurality of impedance converting means provided between the matching means and the radio-frequency generator,
   wherein the impedance converting means includes a capacitor and an inductor which reduce an impedance difference between an output impedance of the radio-frequency generator, and an input impedance of the matching means.

2. A plasma processing apparatus according to claim 1, wherein the one or plurality of impedance converting means converts an output impedance to a value close to the impedance of the plasma processing chamber between the output impedance of the radio-frequency generator and the impedance of the chamber.

3. A plasma processing apparatus according to claim 1, wherein the one or plurality of impedance converting means converts an output impedance to a value close to the impedance of the plasma processing chamber between the output impedance of the radio-frequency generator and the impedance of the chamber.

4. A plasma processing apparatus according to claim 1, wherein the one plurality of impedance converting means converts the impedance from 50 Ω to 10 Ω or less.

5. A plasma processing apparatus comprising
   a radio-frequency generator;
   a plasma processing chamber;
   matching circuitry for performing impedance matching between the radio frequency generator and the plasma processing chamber; and
   at least one impedance converting circuit provided between the matching circuit and the radio-frequency generator,
   wherein the impedance converting means includes a capacitor and an inductor which reduce an impedance difference between an output impedance of the radio-frequency generator, and an input impedance of the matching means.

6. A plasma processing apparatus according to claim 5, wherein the impedance converting circuit comprises at least one inductor and at least one capacitor.

7. A plasma processing apparatus according to claim 6, wherein the at least one capacitor and at least one inductor have fixed values.

8. A plasma processing apparatus according to claim 5, wherein the impedance converting circuit provides matching between the output impedance of a characteristic impedance of a coaxial cable connected to the radio frequency generator and the impedance of the plasma processing chamber.

9. A plasma processing apparatus according to claim 5, wherein the at least one impedance converting circuit converts an output impedance to a value close to the impedance of the plasma processing chamber between the output impedance of the radio-frequency generator and the impedance of the chamber.

10. A plasma processing apparatus according to claim 5, wherein the at least one impedance converting circuit converts an output impedance to value close to the impedance of the plasma processing chamber between the output impedance of the radio-frequency generator and the impedance of the chamber.

11. A plasma processing apparatus according to claim 5, wherein the at least one impedance converting circuit converts the impedance from 50 Ω to 10 Ω or less.

* * * * *